(12) United States Patent
Shpaisman et al.

(10) Patent No.: US 11,596,070 B2
(45) Date of Patent: Feb. 28, 2023

(54) APPARATUS FOR USE IN PREPARING A PRINTED CIRCUIT BOARD AND PHOTOSENSITIVE INK FOR IN AN INK JET PRINTER

(71) Applicant: Orbotech Ltd., Yavne (IL)

(72) Inventors: Nava Shpaisman, Nachala Kedumim (IL); Abraham Gross, Ramat Aviv (IL); Arie Glazer, Mevaseret (IL)

(73) Assignee: Orbotech Ltd., Yavne (IL)

( * ) Notice: Subject to any disclaimer, the term of this patent is extended or adjusted under 35 U.S.C. 154(b) by 0 days.

(21) Appl. No.: 17/425,023

(22) PCT Filed: Feb. 11, 2020

(86) PCT No.: PCT/IL2020/050160
§ 371 (c)(1),
(2) Date: Jul. 22, 2021

(87) PCT Pub. No.: WO2020/165897
PCT Pub. Date: Aug. 20, 2020

(65) Prior Publication Data
US 2022/0104360 A1     Mar. 31, 2022

Related U.S. Application Data

(60) Provisional application No. 62/805,318, filed on Feb. 14, 2019.

(51) Int. Cl.
*H05K 3/06* (2006.01)
*H05K 3/12* (2006.01)
(Continued)

(52) U.S. Cl.
CPC ............. *H05K 3/064* (2013.01); *C09D 11/30* (2013.01); *H05K 3/002* (2013.01); *H05K 3/068* (2013.01);
(Continued)

(58) Field of Classification Search
CPC ........ H05K 3/064; H05K 3/002; H05K 3/068; H05K 3/125; H05K 3/1283; H05K 2203/013; C09D 11/30
See application file for complete search history.

(56) References Cited

U.S. PATENT DOCUMENTS 4,956,035 A    9/1990  Sedlak
6,076,723 A    6/2000  Pan
(Continued)

FOREIGN PATENT DOCUMENTS

CN    102361542 A    2/2012
CN    110337191 A   10/2019
(Continued)

OTHER PUBLICATIONS

Horng-Show Koo, Mi Chen, Feng-Mei Wu, Li-Ping Cho and Tomoji Kawai, "Tunable synthesis, dispersion and physical characterization of nanoparticle-based organic resists for inkjet printing," 2008 2nd IEEE International Nanoelectronics Conference, 2008, pp. 89-92, doi: 10.1109/INEC.2008.4585443. (Year: 2008).*
(Continued)

*Primary Examiner* — A. Dexter Tugbang
(74) *Attorney, Agent, or Firm* — Hodgson Russ LLP (57) ABSTRACT

An apparatus is used in preparing a printed circuit board (PCB). The apparatus can include a common chassis, an inkjet printer mounted on the common chassis, and a pattern exposer mounted on the common chassis. The inkjet printer can selectively print unexposed photosensitive patterns on a PCB substrate with a photosensitive ink. The pattern exposer can expose said photosensitive patterns to radiation thereby defining exposed patterns. A photosensitive ink for use in an ink jet printer can include a photoresist, a solvent, a humectant, a surfactant, an adhesion promoter, and a basic solution. The adhesion promoter is operative to increase anisotropy of
(Continued)

a wet etching process of a copper component on which said photosensitive ink is printed.

14 Claims, 6 Drawing Sheets

(51) Int. Cl.
 *H05K 3/00* (2006.01)
 *C09D 11/30* (2014.01)
(52) U.S. Cl.
 CPC ........... *H05K 3/125* (2013.01); *H05K 3/1283* (2013.01); *H05K 2203/013* (2013.01)

(56) References Cited

U.S. PATENT DOCUMENTS

| | | | |
|---|---|---|---|
| 6,709,962 B2 | 3/2004 | Berg | |
| 6,754,551 B1 | 6/2004 | Zohar et al. | |
| 6,956,082 B1* | 10/2005 | Johnson | C09D 11/30 524/556 |
| 7,427,360 B2 | 9/2008 | Hopper et al. | |
| 7,442,408 B2 | 10/2008 | Saksa et al. | |
| 7,524,015 B2 | 4/2009 | Srinivasan et al. | |
| 7,537,799 B2 | 5/2009 | Etheridge | |
| 7,560,215 B2 | 7/2009 | Sharma et al. | |
| 7,653,990 B2 | 2/2010 | Lee et al. | |
| 7,682,652 B2 | 3/2010 | Baik et al. | |
| 7,757,628 B2 | 7/2010 | Fumo et al. | |
| 7,757,631 B2 | 7/2010 | Devos et al. | |
| 7,834,274 B2 | 11/2010 | Yang et al. | |
| 7,896,483 B2 | 3/2011 | Etheridge | |
| 7,981,508 B1 | 7/2011 | Sharma et al. | |
| 3,313,173 A1 | 11/2012 | Nawrocki et al. | |
| 3,313,571 A1 | 11/2012 | Nawrocki et al. | |
| 8,418,355 B2 | 4/2013 | Kim et al. | |
| 8,531,751 B2 | 9/2013 | Heinemann et al. | |
| 8,659,158 B2 | 2/2014 | Cai et al. | |
| 8,770,563 B2 | 7/2014 | Katz | |
| 9,085,157 B2 | 7/2015 | Vodopivec | |
| 9,221,265 B2 | 12/2015 | Vodopivec | |
| 9,713,266 B2 | 7/2017 | Nichols et al. | |
| 10,113,074 B2 | 10/2018 | Cai et al. | |
| 2003/0177639 A1 | 9/2003 | Berg | |
| 2003/0224266 A1 | 12/2003 | Akagawa et al. | |
| 2004/0077112 A1 | 4/2004 | Elliott | |
| 2004/0244643 A1 | 12/2004 | Voeght et al. | |
| 2005/0080152 A1* | 4/2005 | Bergiers | C09D 11/30 522/71 |
| 2005/0130397 A1 | 6/2005 | Bentley et al. | |
| 2005/0170291 A1 | 8/2005 | Berg | |
| 2005/0227049 A1 | 10/2005 | Boyack et al. | |
| 2006/0001726 A1 | 1/2006 | Kodas et al. | |
| 2006/0093732 A1 | 5/2006 | Schut et al. | |
| 2007/0014974 A1 | 1/2007 | Vronsky | |
| 2009/0249976 A1 | 10/2009 | Etheridge | |
| 2009/0291230 A1 | 11/2009 | Lin et al. | |
| 2010/0152316 A1* | 6/2010 | Cornell | C09D 11/30 522/170 |
| 2013/0230940 A1 | 9/2013 | Shieh et al. | |
| 2016/0050750 A1 | 2/2016 | Rogers et al. | |
| 2017/0225447 A1 | 8/2017 | Varadan et al. | |
| 2018/0192521 A1 | 7/2018 | Shpaisman et al. | |
| 2018/0229516 A1 | 8/2018 | Cloots | |
| 2018/0356731 A1 | 12/2018 | Tagawa | |

FOREIGN PATENT DOCUMENTS

| | | | | |
|---|---|---|---|---|
| JP | H09214110 A | | 8/1997 | |
| JP | H1075036 A | | 3/1998 | |
| JP | 2007110065 A | * | 4/2007 | ............ H05K 3/064 |
| JP | 2009506187 A | | 2/2009 | |
| JP | 2012084579 A | | 4/2012 | |

OTHER PUBLICATIONS

WIPO, International Search Report for International Application No. PCT/IL2020/050160, dated May 31, 2020.
WIPO, Written Opinion of the International Searching Authority for International Application No. PCT/IL2020/050160, dated May 31, 2020.
CNIPA, First Office Action for CN Application No. 202080004537.9, dated Oct. 9, 2021 (see X/Y/A designations at p. 6).
KIPO, First Office Action for KR Application No. 20217029459, dated Jan. 19, 2022.
JPO, Office Action for JP Application No. 2021547478, dated Jul. 12, 2022.
EPO, European Search Report and Search Opinion for EP Application No. 20755391.0, dated Sep. 22, 2022.

* cited by examiner

APPARATUS FOR USE IN PREPARING A PRINTED CIRCUIT BOARD AND PHOTOSENSITIVE INK FOR IN AN INK JET PRINTER

FIELD OF THE INVENTION

The present invention relates to printed circuit board (PCB) production based on ink jetting of liquid photoresist material.

BACKGROUND OF THE INVENTION

Various systems and methods for producing PCBs are known in the art.

SUMMARY OF THE INVENTION

The present invention seeks to provide improved systems and methods for printed circuit board (PCB) production based on ink jetting of liquid photoresist material.

There is thus provided in accordance with a preferred embodiment of the present invention a method for preparing a PCB product having highly dense conductors, the method including providing a PCB substrate including a conductive layer, employing an inkjet printer to selectively print unexposed photosensitive patterns on the PCB substrate, the unexposed photosensitive patterns having a thickness of less than 5 µm, exposing the photosensitive patterns to radiation thereby to define exposed patterns, the exposed patterns having a pitch less than 20 µm and wet etching the conductive layer in accordance with a pattern defined by the exposed patterns thereby to define the highly dense conductors having a pitch of less than 30 µm.

Preferably, the highly dense conductors have a pitch of less than 25 µm. More preferably, the highly dense conductors have a pitch of less than 20 µm.

In accordance with a preferred embodiment of the present invention the conductive layer is a copper layer.

In accordance with a preferred embodiment of the present invention the method also includes employing an inkjet printer to selectively print non-oxygen permeable patterns subsequent to the employing an inkjet printer to selectively print unexposed photosensitive patterns and prior to the exposing the photosensitive patterns. Additionally, the non-oxygen permeable patterns have a height of less than 3 µm. Additionally or alternatively, the non-oxygen permeable patterns are transparent to the radiation. Preferably, printing of the non-oxygen permeable patterns does not increase the pitch of the exposed patterns.

In accordance with a preferred embodiment of the present invention the method also includes inspecting at least one of the unexposed photosensitive patterns and the non-oxygen permeable patterns prior to the exposure of the unexposed photosensitive patterns and the non-oxygen permeable patterns to radiation.

In accordance with a preferred embodiment of the present invention the method also includes registration of the PCB substrate prior to the employing an inkjet printer to selectively print unexposed photosensitive patterns.

Preferably, the unexposed photosensitive patterns are printed with a photosensitive ink including a photoresist constituting 33-64 wt. % of the photosensitive ink, a solvent constituting 19.99-59.99 wt. % of the photosensitive ink, a humectant constituting 1-10 wt. % of the photosensitive ink, a surfactant constituting 0.01-0.1 wt. % of the photosensitive ink, an adhesion promoter constituting 1-3 wt. % of the photosensitive ink, the adhesion promoter having a molecular weight between 1700-70000 Da, and a basic solution constituting 2-3 wt. % of the photosensitive ink, the adhesion promoter being dissolved in the basic solution.

In accordance with a preferred embodiment of the present invention the adhesion promoter is operative to increase anisotropy of a wet etching process of a copper component on which the photosensitive ink is printed. Additionally or alternatively, the photosensitive ink has a surface tension of less than 30 dyn/cm.

In accordance with a preferred embodiment of the present invention the non-oxygen permeable patterns are printed with a non-oxygen permeable ink including a polymer constituting 10-15 wt. % of the non-oxygen permeable ink, the polymer having a minimum molecular weight of 7000 Da, one or more solvents constituting a total of 63.9-68.99 wt. % of the non-oxygen permeable ink, a thickener solvent constituting 20 wt. % of the non-oxygen permeable ink, a humectant constituting 1 wt. % of the non-oxygen permeable ink and a surfactant constituting 0.01-0.1 wt. % of the non-oxygen permeable ink.

Preferably, the non-oxygen permeable ink is transparent to light having a wavelength between 355-460 nm. Additionally or alternatively, the non-oxygen permeable ink has a surface tension of less than 30 dyn/cm.

There is also provided in accordance with another preferred embodiment of the present invention apparatus for use in preparing a PCB product having highly dense conductors, the apparatus including a common chassis, an inkjet printer mounted on the common chassis and being operative to selectively print unexposed photosensitive patterns on a PCB substrate, the unexposed photosensitive patterns having a thickness of less than 5 µm, and a pattern exposer mounted on the common chassis and being operative to expose the photosensitive patterns to radiation thereby to define exposed patterns, the exposed patterns having a pitch of less than 20 µm.

In accordance with a preferred embodiment of the present invention the inkjet printer includes a first inkjet head operative to print the unexposed photosensitive patterns of photosensitive ink and a second inkjet head operative to print non-oxygen permeable patterns of non-oxygen permeable ink. Additionally, the nozzle plates of the inkjet heads are operative to be heated to between 40-60° C. for optimum viscosity of the photosensitive ink and the non-oxygen permeable ink.

In accordance with a preferred embodiment of the present invention the apparatus includes a hood at least partially surrounding the common chassis, the inkjet printer and the pattern exposer. Additionally, the atmosphere in the hood is characterized by an inert gas flow operative to prevent oxidation of the unexposed photosensitive patterns during exposure thereof by the pattern exposer.

Preferably, the apparatus also includes at least a first ink dryer, operative to dry the unexposed photosensitive patterns. Additionally, the first inkjet head, the at least first ink dryer and the second inkjet head are arranged such that stepwise advancement of the PCB substrate along the common chassis allows the unexposed photosensitive patterns to be dried by the at least first ink dryer before the second inkjet head prints the non-oxygen permeable patterns.

Preferably, the apparatus also includes a camera operative to inspect at least one of the unexposed photosensitive patterns and the non-oxygen permeable patterns.

In accordance with a preferred embodiment of the present invention the pattern exposer includes at least one light source that emits light in a range between 355-460 nm.

Preferably, the pattern exposer is a laser direct imaging exposer. Alternatively, the pattern exposer is an LED exposer.

In accordance with a preferred embodiment of the present invention the apparatus also includes a camera operative to register the PCB substrate.

In accordance with a preferred embodiment of the present invention, the apparatus also includes a common stage. Additionally, the common stage is heated to a maximum temperature of 80° C. to aid drying of at least one of the photosensitive ink and the non-oxygen permeable ink.

In accordance with a preferred embodiment of the present invention the unexposed photosensitive patterns are printed with a photosensitive ink including a photoresist constituting 33-64 wt. % of the photosensitive ink, a solvent constituting 19.99-59.99 wt. % of the photosensitive ink, a humectant constituting 1-10 wt. % of the photosensitive ink, a surfactant constituting 0.01-0.1 wt. % of the photosensitive ink, an adhesion promoter constituting 1-3 wt. % of the photosensitive ink, the adhesion promoter having a molecular weight between 1700-70000 Da, and a basic solution constituting 2-3 wt. % of the photosensitive ink, the adhesion promoter being dissolved in the basic solution.

In accordance with a preferred embodiment of the present invention the adhesion promoter is operative to increase anisotropy of a wet etching process of a copper component on which the photosensitive ink is printed. Additionally or alternatively, the photosensitive ink has a surface tension of less than 30 dyn/cm.

In accordance with a preferred embodiment of the present invention the non-oxygen permeable patterns are printed with a non-oxygen permeable ink including a polymer constituting 10-15 wt. % of the non-oxygen permeable ink, the polymer having a minimum molecular weight of 7000 Da, one or more solvents constituting a total of 63.9-68.99 wt. % of the non-oxygen permeable ink, a thickener solvent constituting 20 wt. % of the non-oxygen permeable ink, a humectant constituting 1 wt. % of the non-oxygen permeable ink and a surfactant constituting 0.01-0.1 wt. % of the non-oxygen permeable ink.

Preferably, the non-oxygen permeable ink is transparent to light having a wavelength between 355-460 nm. Additionally or alternatively, the non-oxygen permeable ink has a surface tension of less than 30 dyn/cm.

There is further provided in accordance with yet another preferred embodiment of the present invention apparatus for use in preparing a PCB product having highly dense conductors, the apparatus including a common stage, an inkjet printer operative to selectively print unexposed patterns on a PCB substrate on the stage, the unexposed patterns having thickness of less than 8 μm, and a pattern exposer being operative to expose the patterns on the PCB substrate on the stage to radiation thereby to define exposed patterns, the exposed patterns having a pitch of less than 20 μm.

In accordance with a preferred embodiment of the present invention the inkjet printer includes a first inkjet head operative to print the unexposed photosensitive patterns of photosensitive ink and a second inkjet head operative to print non-oxygen permeable patterns of non-oxygen permeable ink. Additionally, the nozzle plates of the inkjet heads are operative to be heated to between 40-60° C. for optimum viscosity of the photosensitive ink and the non-oxygen permeable ink.

Preferably, the apparatus also includes a hood at least partially surrounding the common stage, the inkjet printer and the pattern exposer. Additionally, the atmosphere in the hood is characterized by an inert gas flow operative to prevent oxidation of the unexposed photosensitive patterns during exposure thereof by the pattern exposer.

In accordance with a preferred embodiment of the present invention the apparatus also includes at least a first ink dryer, operative to dry the unexposed photosensitive patterns. Additionally, the first inkjet head, the at least first ink dryer and the second inkjet head are arranged such that stepwise advancement of the PCB substrate by the common stage allows the unexposed photosensitive patterns to be dried by the at least first ink dryer before the second inkjet head prints the non-oxygen permeable patterns.

Preferably, the apparatus also includes a camera operative to inspect the at least one of the unexposed photosensitive patterns and the non-oxygen permeable patterns.

In accordance with a preferred embodiment of the present invention the pattern exposer includes at least one light source that emits light in a range between 355-460 nm. Preferably, the pattern exposer is a laser direct imaging exposer. Alternatively, the pattern exposer is an LED exposer.

In accordance with a preferred embodiment of the present invention the apparatus also includes a camera operative to register the PCB substrate.

Preferably, the apparatus also includes a common chassis.

In accordance with a preferred embodiment of the present invention the common stage is heated to a maximum temperature of 80° C. to aid drying of at least one of the unexposed photosensitive ink and the non-oxygen permeable ink.

In accordance with a preferred embodiment of the present invention the unexposed photosensitive patterns are printed with a photosensitive ink including a photoresist constituting 33-64 wt. % of the photosensitive ink, a solvent constituting 19.99-59.99 wt. % of the photosensitive ink, a humectant constituting 1-10 wt. % of the photosensitive ink, a surfactant constituting 0.01-0.1 wt. % of the photosensitive ink, an adhesion promoter constituting 1-3 wt. % of the photosensitive ink, the adhesion promoter having a molecular weight between 1700-70000 Da, and a basic solution constituting 2-3 wt. % of the photosensitive ink, the adhesion promoter being dissolved in the basic solution.

Preferably, the adhesion promoter is operative to increase anisotropy of a wet etching process of a copper component on which the photosensitive ink is printed. Additionally or alternatively, the photosensitive ink has a surface tension of less than 30 dyn/cm.

In accordance with a preferred embodiment of the present invention the non-oxygen permeable patterns are printed with a non-oxygen permeable ink including a polymer constituting 10-15 wt. % of the non-oxygen permeable ink, the polymer having a minimum molecular weight of 7000 Da, one or more solvents constituting a total of 63.9-68.99 wt. % of the non-oxygen permeable ink, a thickener solvent constituting 20 wt. % of the non-oxygen permeable ink, a humectant constituting 1 wt. % of the non-oxygen permeable ink and a surfactant constituting 0.01-0.1 wt. % of the non-oxygen permeable ink.

Preferably, the non-oxygen permeable ink is transparent to light having a wavelength between 355-460 nm. Additionally or alternatively, the non-oxygen permeable ink has a surface tension of less than 30 dyn/cm.

There is yet further provided in accordance with still another preferred embodiment of the present invention a photosensitive ink for use in an inkjet printer, the photosensitive ink including a photoresist constituting 33-64 wt. % of the photosensitive ink, a solvent constituting 19.99-59.99 wt. % of the photosensitive ink, a humectant constituting 1-10 wt. % of the photosensitive ink, a surfactant constituting 0.01-0.1 wt. % of the photosensitive ink, an adhesion promoter constituting 1-3 wt. % of the photosensitive ink, the adhesion promoter having a molecular weight between 1700-70000 Da, and a basic solution constituting 2-3 wt. % of the photosensitive ink, the adhesion promoter being dissolved in the basic solution.

Preferably, the adhesion promoter is operative to increase anisotropy of a wet etching process of a copper component on which the photosensitive ink is printed. Additionally or alternatively, the photosensitive ink has a surface tension of less than 30 dyn/cm.

In accordance with a preferred embodiment of the present invention the photosensitive ink is operative to form printed features having a height of less than 5 µm.

There is even further provided in accordance with another preferred embodiment of the present invention a non-oxygen permeable ink for use in an inkjet printer including a polymer constituting 10-15 wt. % of the non-oxygen permeable ink, the polymer having a minimum molecular weight of 7000 Da, one or more solvents constituting a total of 63.9-68.99 wt. % of the non-oxygen permeable ink, a thickener solvent constituting 20 wt. % of the non-oxygen permeable ink, a humectant constituting 1 wt. % of the non-oxygen permeable ink and a surfactant constituting 0.01-0.1 wt. % of the non-oxygen permeable ink.

In accordance with a preferred embodiment of the present invention the non-oxygen permeable ink is transparent to light having a wavelength between 355-460 nm. Additionally or alternatively, the non-oxygen permeable ink has a surface tension of less than 30 dyn/cm.

Preferably, the non-oxygen permeable ink is operative to form printed features having a height of less than 3 µm.

There is also provided in accordance with yet another preferred embodiment of the present invention a method for preparing a PCB product, the method including providing a PCB substrate including a conductive layer, employing an inkjet printer for selectively printing unexposed photosensitive patterns on the PCB substrate and exposing the photosensitive patterns to radiation thereby to define exposed patterns, characterized in that the printing unexposed photosensitive patterns includes printing and drying multiple layers, layer by layer, such that a layer is dried prior to printing a subsequent layer thereof, thereby to reduce or eliminate creation of pinholes.

There is further provided in accordance with still another preferred embodiment of the present invention a method for preparing a PCB product, the method including providing a PCB substrate including a conductive layer, wipe cleaning the conductive layer with a liquid photoresist ink solvent and thereafter employing an inkjet printer for selectively printing unexposed photosensitive patterns on the PCB substrate.

There is still further provided in accordance with yet another preferred embodiment of the present invention a method for preparing a PCB product, the method including providing a PCB substrate including a conductive layer and employing an inkjet printer for selectively printing through-hole via filling material ink at selected locations on the PCB substrate.

There is also provided in accordance with still another preferred embodiment of the present invention apparatus for use in preparing a PCB product including via through-holes, the apparatus including a common stage which is characterized in that it includes a PCB substrate supporting surface that is light scattering, a laser light generator causing laser light to impinge on the PCB substrate supporting surface, whereby laser light that reaches the PCB substrate supporting surface through the via through-holes is scattered so as to also impinge on sidewalls of the via through-holes, thereby causing polymerization of photoresist within the via through-holes.

Preferably, the PCB substrate supporting surface is laser light diffusing.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1A:
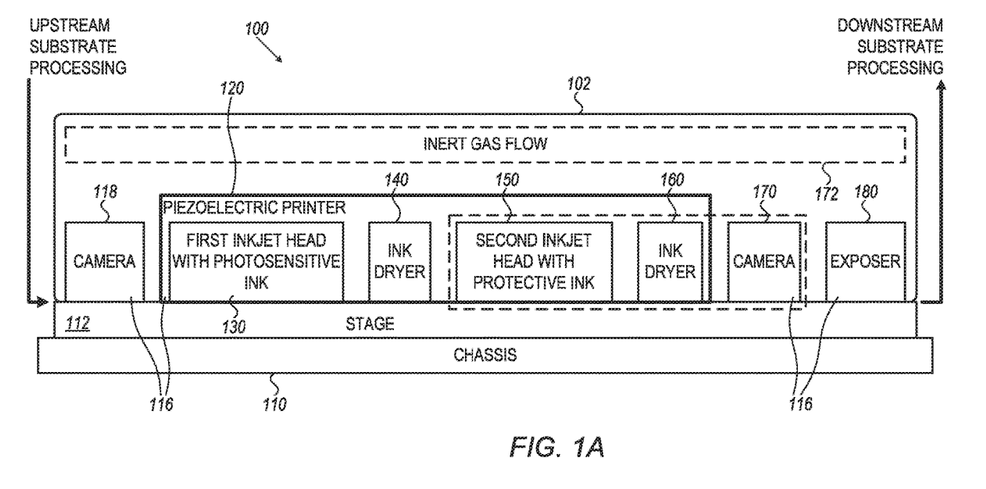
FIGS. 1A and 1B are simplified schematic illustrations of two alternative embodiments of a computer-controlled product preparation mini environment (CCPPME) constructed and operative in accordance with a preferred embodiment of the present invention.

Reference is now made to FIG. 1A, which is a simplified schematic illustration of a computer-controlled product preparation mini environment (CCPPME) 100 constructed and operative in accordance with a preferred embodiment of the present invention. It is noted that FIG. 1A is not drawn to scale, and dashed lines are drawn around sub-systems that are present only in some embodiments of the present invention. It is further noted that CCPPME 100 is operative to print and expose photosensitive features on a variety of substrates, including, inter alia, flex boards, porous boards and roll-to-roll. CCPPME 100 preferably includes a roll-to roll processing system (not shown), such as the roll-to-roll processing system described in U.S. Patent Publication Nos. 2017/0225447 or 2018/0229516, the disclosures of which are hereby incorporated by reference.

As seen in FIG. 1A, CCPPME 100 preferably includes a hood 102, which is mounted above a common chassis 110 having a common stage 112. Common stage 112 is operative to advance substrates, typically printed circuit board (PCB) substrates 114, shown and described hereinbelow with reference to FIGS. 2A-2C, through various sub-systems 116 of CCPPME 100. A typical common stage 112 is constructed and operative as described in assignee's U.S. Pat. No. 8,770,563, the disclosure of which is hereby incorporated by reference.

Preferably, common stage 112 has a high degree of flatness, for example a slope of less than 50 µm over an 800 mm length. Furthermore, the vacuum produced within stage 112 is preferably strong enough to hold PCB substrates having a thickness of between 0.05 mm and 10 mm.

Preferably, a first sub-system 116 of CCPPME 100 includes a camera 118, such as a TTDCMOS 120, commercially available from TechnoTeam Bildverarbeitung GmbH, Ilmenau, Germany. Camera 118 is operative to register a PCB substrate 114 prior to further processing by CCPPME 100. It is appreciated that common stage 112 advances PCB substrate 114 in an unchanging manner, such that following registration of PCB substrate 114 by camera 118, no further registration is necessary while PCB substrate 114 is supported by common stage 112. Furthermore, common stage 122 is preferably heated, preferably to a maximum temperature of 100° C. to aid drying of ink as soon as it is printed. More preferably, the common stage 122 is heated to a maximum temperature of 80° C. to aid drying of ink as soon as it is printed. Further preferably, the common stage 122 is heated to a maximum temperature of 50° C. to aid drying of ink as soon as it is printed. Preferably, another sub-system 116 of CCPPME 100 includes a high-throughput piezoelectric inkjet printer (HTPIJ) 120, which includes at least a first high-throughput bidirectional piezoelectric inkjet head (HTBPIH) 130, operative to print photosensitive ink, and at least a first ink dryer 140, operative to dry photosensitive ink printed on PCB substrate 114 by first HTBPIH 130. HTPIJ 120 may optionally include a second HTBPIH 150, which may be identical to first HTBPIH 130, operative to print non-oxygen permeable ink, and a second ink dryer 160, operative to dry non-oxygen permeable ink printed on PCB substrate 114 by second HTBPIH 150.

Preferably, both first HTBPIH 130 and second HTBPIH 150 are formed of a material that is not soluble in solvents used in the inks of the present invention, which are described hereinbelow. Each of first HTBPIH 130 and second HTBPIH 150 preferably operates at a frequency between 5-100 kHz and includes a plurality of nozzles, each between 6-60 pL in volume, and nozzle plates operative to be heated, preferably to a temperature of to between 25-80° C. for optimum viscosity of the photosensitive ink and the, non-oxygen permeable ink. More preferably, the nozzle plates of the inkjet heads are operative to be heated to between 40-60° C. for optimum viscosity of the photosensitive ink and the non-oxygen permeable ink. Alternatively, the nozzle plates of the inkjet heads are operative to be heated to between 25-50° C. for optimum viscosity of the photosensitive ink and the non-oxygen permeable ink HTPIJ 120 may be constructed and operative as described in U.S. Pat. Nos. 7,757,628, 9,085,157 and 9,221,265, the disclosures of which are hereby incorporated by reference.

It is a particular feature of an embodiment of the present invention that first HTBPIH 130, first ink dryer 140 and second HTBPIH 150 are arranged such that stepwise advancement of PCB substrate 114 allows the photosensitive ink printed by first HTBPIH 130 to be dried by first ink dryer 140 before being overprinted by second HTBPIH 150.

It is appreciated that printing and drying layer by layer is helpful in avoiding pinhole formation, which might otherwise occur due to differences in evaporation rates of the various ink components. Typically, high vapor pressure solvents in the ink evaporate initially, thereby increasing the viscosity of the ink, and may lead to the creation of a thin polymer film. The lower vapor pressure solvents which evaporate thereafter might otherwise create a pinhole as the evaporated gas passes through the thin polymer layer. Drying a previously printed photosensitive ink layer prior to the printing of a subsequent non-oxygen permeable ink layer avoids the formation of a thin polymer film and thus avoids pinholes.

First ink dryer 140 and second ink dryer 160 may each be any suitable dryer, such as an air flow dryer, a linear IR lamp, a scanning IR lamp, a flash lamp, a vacuum dryer, a heated stage dryer or any combination thereof. By varying the print settings and the ink used, HTPIJ 120 provides for the printing of features having length and width dimensions as small as 50 µm, and a height of 0.5-5 µm.

A further, optional, sub-system 116 of CCPPME 100 includes a second camera 170, such as a TTDCMOS 120, commercially available from TechnoTeam Bildverarbeitung GmbH, Ilmenau, Germany. Second camera 170 is operative to inspect printed features.

In some embodiments, the atmosphere in CCPPME 100, specifically within hood 102 thereof, includes an inert gas flow 172, such as flowing $N_2$, operative to prevent oxidation of printed features during exposure. It is noted that the pressure within CCPPME 100 remains at ambient pressure, whether inert gas flow 172 is included in CCPPME 100 or whether inert gas flow 172 is not included.

In some embodiments, the atmosphere in CCPPME 100, specifically within hood 102 thereof, may include clean air, thereby providing a clean environment, for example, class <100,000, at positive pressure.

A further sub-system 116 of CCPPME 100 includes a pattern exposer 180, preferably a laser direct imaging (LDI) sub-system, operative to selectively expose portions of the photosensitive ink printed by first HTBPIH 130. Pattern exposer 180 is operative to expose photosensitive printed patterns to laser radiation, defining exposed patterns having a Line/Space (L/S) as small as 5/5 µm. A typical pattern exposer 180 includes at least one light source that emits light in a range between 355-460 nm, and may be constructed and operative as described in U.S. Pat. No. 8,531,751, the disclosure of which is hereby incorporated by reference.

It is appreciated that the sum of the two values of one L/S measurement is equal to the pitch of a repeating pattern. Thus, an L/S of 5/5 µm is equivalent to a pitch of 10 µm. The first value of an L/S measurement denotes the regular length or width dimension of repeating features, and the second value of an L/S measurement denotes the regular length or width dimension of the spaces between repeating features.

Alternatively, the pattern exposer 180 may be any other suitable exposure system, such as an LED exposer. A typical LED exposer that may be adopted for such exposure is the Orbotech Diamond™ 8, commercially available from Orbotech, Yavne, Israel.

Figure 1B:
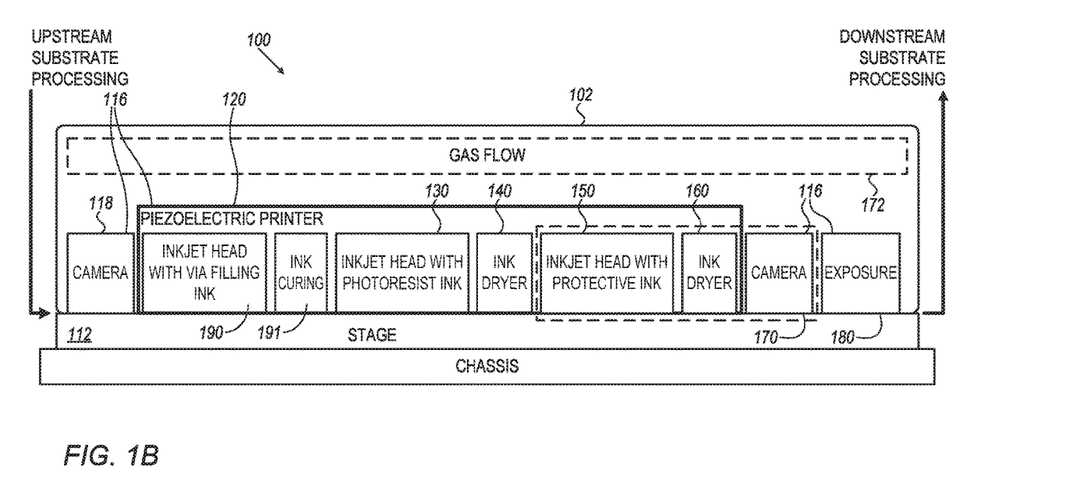

Reference is now made to FIG. 1B, which illustrates an alternative to the embodiment of FIG. 1A and includes all of the elements thereof as described hereinabove. As seen in FIG. 1B, an additional HTBPIH 190 is provided and is operative to print through-hole via filling material ink. An additional ink curing apparatus 191 is also provided and is operative to cure the through-hole via filling material ink deposited within the through-hole vias of the PCB substrate by additional HTBPIH 190.

Preferably common stage 112 is coated with a light diffusing layer or is processed to be light scattering in another manner, such as, for example scrubbing or chemical roughening. In this way laser light that impinges on the light diffusing layer through the via through-holes is scattered to also impinge on sidewalls of the via through-holes. This scattered laser light causes polymerization of photoresist within the via through-holes. In particular the scattered laser light causes polymerization of the photoresist on side walls of the via through-holes that didn't receive enough direct laser light to be polymerized.

Preferably, the scattered light inside the via through-holes will expose the entire inner via through-hole surface. As is well known, photoresist requires a certain exposure light energy to be fully polymerized and since the via through-hole inner surface may be larger than the via through-hole circular area, it may be required to increase exposure light intensity whenever the exposure is impinging on via through-hole areas. Another reason to increase exposure light intensity inside the via through-hole may be due to reduced reflectivity of the bottom of the via through-hole, or non-uniform scattering from the surface. To increase exposure intensity for the via through-holes, the direct imaging light should be increased accordingly, for example, by raising the modulated laser scanning spot power at the corresponding via through-hole area.

It is appreciated that both negative and positive photoresists may be employed in embodiments of the present invention.

Photosensitive inks that are suitable for use in conjunction with first HTBPIH 130 of CCPPME 100 preferably include a photoresist to which is added a solvent, a humectant, a surfactant and an adhesion promoter. When using a photoresist that includes a surfactant, the use of an additional surfactant may be obviated. In some embodiments, a banking agent may be added to the photosensitive ink. Alternatively, the adhesion promoter may also function as a banking agent.

As noted above, the photosensitive ink preferably includes a photoresist. Preferably, the photoresist used in the photosensitive ink of the present invention is a negative photoresist which is either a radical polymerization photoresist, such as Diaetch 100 and DET 765.12, commercially available from HTP HiTech Photopolymere AG, Basel, Switzerland, or PHOTOPOSIT™ SN68H, commercially available from Dow, Inc., USA or a photo-dimerization polymerization photoresist, such as DET 539.72 and DET 539.21, commercially available from HTP HiTech Photopolymere AG, Basel, Switzerland. Alternatively, the photoresist used in the photosensitive ink of the present invention may be one of LP7609H, LP7803D1 and LP7901V, commercially available from Great Eastern Resins Industrial Co. Ltd., Taichung City, Taiwan, Longlite® brand commercially available from Chang Chun Group, Taiwan, PHOTRAK™ from Electra Polymers LTD, England and X-77 commercially available from Taiyo Ink, Japan.

As noted above, the photosensitive ink preferably includes a solvent. The solvent reduces the viscosity of the photosensitive ink from the viscosity of the photoresist, which is typically not suitable for ejection from a nozzle, to a viscosity more suitable for ejection from a nozzle, as required for ink-jet printing. Viscosity of the photosensitive ink is preferably in the range of 5-15 cps at the printer operating temperature. Preferably, the solvent has a boiling point below 100° C., aiding fast drying of the photosensitive ink. Additionally, the solvent is preferably of low risk to humans and the environment, having, inter alia, relatively low toxicity, flammability and reactivity properties. Typical solvents includen-propanol, 2-methoxy-2-propanol, iso-butanol, propylene glycol monomethyl ether and isopropyl alcohol.

As noted above, the photosensitive ink preferably includes a humectant. The humectant prevents the photosensitive ink from solidifying on the nozzle plate prior to ejection from first HTBPIH 130. Typical humectants include glycols, such as glycerol (1-3 wt. %), propylene glycol (5-10 wt. %), dipropylene glycol (1-3 wt. %) and triethylene glycol (5-10 wt. %), and glycol ethers, such as diethylene glycol diethyl ether (5-10 wt. %), diethylene glycol dimethyl ether (5-15 wt. %), ethylene glycol monobutyl ether (5-10 wt. %), dipropylene glycol dimethyl ether (2-6 wt. %) and dipropylene glycol monomethyl ether (2-6 wt. %).

As noted above, the photosensitive ink preferably includes a surfactant. The surfactant adjusts the surface tension of the photosensitive ink, affecting both the drop size and wettability thereof. Surface tension of the photosensitive ink is preferably in the range of 20-30 dyn/cm. Drop size of photosensitive ink ejected by first HTBPIH 130 is preferably in the range of 6-60 pL. Wettability is preferably such that the photosensitive ink droplets spread to form a flat deposition on PCB substrate 114, with minimal doming. Typical surfactants include silicon polymers, such as BYK-345 (0.1-0.3 wt. %), BYK-310 (0.1-0.5 wt. %) and BYK-3760 (0.1-0.5 wt. %), commercially available from BYK-Chemie GmbH, Wesel, Germany, and fluoropolymers, such as Capstone™ 1157 (0.01-0.05 wt. %), Capstone™ 1460 (0.05-0.1 wt. %) and Capstone™ 1475 (0.01-0.05 wt. %) commercially available from DuPont, Inc., USA.

As noted above, the photosensitive ink preferably includes an adhesion promoter. The adhesion promoter promotes adhesion of the photosensitive ink to PCB substrate 114 and results in smoother printed features. It is appreciated that the adhesion promoter, in particular an adhesion promoter having a high acid number, increases the solubility of the non-exposure photopolymer during developing and improves the stability of features printed with the photosensitive ink during etching thereof, even for features having length and width dimensions as small as 5 μm. The molecular weight of the adhesion promoter is preferably between 1000-70000 Da. Some polymer chains of adhesion promoters, having a molecular weight in the range of 8000-70000 Da, may extend beyond the width of the photosensitive ink features being printed. In such a case, most of the extending polymer chains will be removed by the pressure of a liquid etchant sprayed onto the substrate during the etching step. The remaining extending polymer chains act as a banking agent, adsorbing to the sidewall of the etched material and preventing undesirous isotropic etching thereof. Typical adhesion promoters have a high acid number and include Joncryl® 682, Joncryl® ECO 684, Joncryl® 680, Joncryl® ECO 675, Joncryl® 678, Joncryl® HPD 696 and Joncryl® HPD 671, commercially available from BASF, Ludwigshafen, Germany. Adhesion promoters are preferably dissolved in a basic solution, e.g., 2-amino-2-methyl 1-propanol (0.5-4 wt. %), 2-dimethylaminoethanol (0.5-4 wt. %) or ethanol amine.

A general procedure for preparing photosensitive inks suitable for use in conjunction with first HTBPIH 130 of CCPPME 100 is as follows. In a first step, a solvent, a basic solution and an adhesion promoter are mixed together in a low shear mixer (<500 rpm), preferably for 10 minutes. In a second step, a surfactant and a humectant are added to the mixer and the solution is mixed, preferably for an additional 5 minutes. In a final mixing step, the photoresist solution is added to the mixer and mixed, preferably for an additional 10 minutes. Thereafter, the solution is filtered through a membrane, preferably having a pore size of approximately 0.2 μm. It is noted that the preparation of photosensitive inks is performed under yellow light conditions.

Examples of Photosensitive Ink Formulations

Tables 1-5 shows examples of photosensitive ink formulations suitable for use in conjunction with first HTBPIH 130 of CCPPME 100.

TABLE 1

| Ingredient | Function | Amount (wt. %) |
| --- | --- | --- |
| DET 539.21 | negative photoresist | 64 |
| n-propanol | Solvent | 22.99 |
| propylene glycol | humectant | 10 |
| Capstone ™ 1157 | surfactant | 0.01 |
| Joncryl ® HPD 696 | adhesion promoter | 1 |
| ethanol amine | basic solution | 2 |

TABLE 2

| Ingredient | Function | Amount (wt. %) |
| --- | --- | --- |
| DET 539.72 | negative photoresist | 33 |
| propylene glycol monomethyl ether | Solvent | 62.99 |
| Glycerol | humectant | 1 |
| Capstone ™ 1157 | surfactant | 0.01 |
| Joncryl ® HPD 696 | adhesion promoter | 1 |
| ethanol amine | basic solution | 2 |

TABLE 3

| Ingredient | Function | Amount (wt. %) |
| --- | --- | --- |
| DET 539.21 | negative photoresist | 64 |
| n-propanol | Solvent | 19.99 |
| propylene glycol | humectant | 10 |
| Capstone ™ 1157 | surfactant | 0.01 |
| Joncryl ® ECO 684 | adhesion promoter | 3 |
| ethanol amine | basic solution | 3 |

TABLE 4

| Ingredient | Function | Amount (wt. %) |
| --- | --- | --- |
| DET 539.72 | negative photoresist | 33 |
| propylene glycol monomethyl ether | Solvent | 59.99 |
| Glycerol | humectant | 1 |
| Capstone ™ 1157 | surfactant | 0.01 |
| Joncryl ® ECO 684 | adhesion promoter | 3 |
| ethanol amine | basic solution | 3 |

TABLE 5

| Ingredient | Function | Amount (wt. %) |
| --- | --- | --- |
| DET 539.72 | negative photoresist | 50 |
| 2-methoxy-2-propanol | Solvent | 41.9 |
| Dipropylene glycol | humectant | 2 |
| BYK-345 | surfactant | 0.1 |
| Joncryl ® ECO 684 | adhesion promoter | 3 |
| ethanol amine | basic solution | 3 |

Non-oxygen permeable inks that are suitable for use in conjunction with second HTBPIH 150 of CCPPME 100 are transparent to the exposure of pattern exposer 180 and preferably include a polymer having a minimum molecular weight of 7000 Da, a solvent, a thickener solvent, a humectant and a surfactant.

The polymer in the non-oxygen permeable ink shields the photosensitive ink from oxygen during the exposure process. Shielding the photosensitive ink from oxygen prevents the polymerization agents in the photosensitive ink from reacting with oxygen instead of polymerizing the photosensitive ink during exposure thereof. Typical polymers include poly(vinyl alcohol)(PVA), polyvinylpyrrolidone (PVP), hemicellulose and Poly(butyl methacrylate-co-(2-dimethylamino ethyl) methacrylate-co-methyl methacrylate).

As noted above, the non-oxygen permeable ink preferably includes a solvent and a thickener solvent. The thickener solvent adjusts the viscosity of the non-oxygen permeable ink to a viscosity suitable for ejection from a nozzle, as required for ink-jet printing. Viscosity of the non-oxygen permeable ink is preferably in the range of 5-15 cps at the printer operating temperature. Preferably, the solvent aids fast drying of the non-oxygen permeable ink, having a boiling point below 100° C. Additionally, the solvent is preferably of low risk to humans and the environment, having, inter alia, relatively low toxicity, flammability and reactivity properties. Typical solvents include water, n-propanol, 2-methoxy-2-propanol and iso-butanol. Typical thickener solvents include propylene glycol (10-20 wt. %), dipropylene glycol (10-20 wt. %) and triethylene glycol (10-20 wt. %).

As noted above, the non-oxygen permeable ink preferably includes a humectant. The humectant prevents the non-oxygen permeable ink from solidifying on the nozzle plate prior to ejection from second HTBPIH 150. Typical humectants include glycols, such as glycerol (1-3 wt. %), and glycol ethers, such as ethylene glycol monobutyl ether (5-10 wt. %) and dipropylene glycol dimethyl ether (2-6 wt. %).

As noted above, the non-oxygen permeable ink preferably includes a surfactant. The surfactant adjusts the surface tension of the non-oxygen permeable ink, affecting both the drop size and wettability thereof. Surface tension of the non-oxygen permeable ink is preferably in the range of 20-30 dyn/cm. Drop size of non-oxygen permeable ink ejected by second HTBPIH 150 is preferably in the range of 6-60 pL. Wettability is preferably such that the non-oxygen permeable ink droplets spread to form a flat deposition on PCB substrate 114, with minimal doming. Typical surfactants include silicon polymers, such as BYK-345 (0.1-0.3 wt. %), BYK-310 (0.1-0.5 wt. %) and BYK-3760 (0.1-0.5 wt. %), commercially available from BYK-Chemie GmbH, Wesel, Germany, and fluoropolymers, such as Capstone™ 1157 (0.01-0.05 wt. %), Capstone™ 1460 (0.05-0.1 wt. %) and Capstone™ 1475 (0.01-0.05 wt. %), commercially available from DuPont, Inc., USA.

A general procedure for preparing non-oxygen permeable inks that are suitable for use in conjunction with second HTBPIH 150 of CCPPME 100 is as follows. In a first step, a solvent, a thickener solvent, a humectant and a surfactant are mixed together in a low shear mixer (<500 rpm), preferably for 5 min, then the mixing shear is increased and the polymer is slowly added and then mixed, preferably for an additional 30 minutes. Thereafter, the solution is filtered through a membrane, preferably having a pore size of approximately 0.2 μm.

Examples of Non-Oxygen Permeable Ink Formulations

Tables 6-7 shows examples of non-oxygen permeable ink formulations suitable for use in conjunction with second HTBPIH 150 of CCPPME 100.

TABLE 6

| Ingredient | Function | Amount (wt. %) |
| --- | --- | --- |
| polyvinylpyrrolidone 360K | polymer | 10 |
| Water | solvent | 58.99 |
| 2-methoxy-2-propanol | solvent | 10 |
| propylene glycol | thickener solvent | 20 |
| glycerol | humectant | 1 |
| Capstone ™ 1157 | surfactant | 0.01 |

TABLE 7

| Ingredient | Function | Amount (wt. %) |
| --- | --- | --- |
| poly(vinyl alcohol) 20K | polymer | 15 |
| Water | solvent | 53.9 |
| n-propanol | solvent | 10 |
| dipropylene glycol | thickener solvent | 20 |
| glycerol | humectant | 1 |
| BYK-345 | surfactant | 0.1 |

Through-hole via filling material inks that are suitable for use in conjunction with additional HTBPIH 190 of CCPPME 100 of FIG. 1B are preferably characterized in that they are stable during developing and etching and are removable by stripping. Curing of the through-hole via filling material ink can be performed by thermal curing or chemical fixation. The through-hole via filling material inks can be, for example positive photoresists, such as NOVOLAC® or polyimide formulations, which are thermally curable. In addition, through-hole via filling can be achieved by employing high acid number acrylic polymers, preferably propionate or butyrate, which are stable at pH<10 and selectively removable at pH=14.

In PCB production, there exist various types of vias which need to be coated and protected during an etching process, such as through-hole vias and micro vias. Through-hole vias may be coated using liquid photoresist, however, in the exposure process the central region of the sidewall of the via may not be polymerized by illumination. As a result, an area of the through-hole may remain unprotected and may be washed out during the etching process. To overcome this problem, a through-hole via filling material ink may be directly and selectively deposited within the through-hole via followed by curing thereof.

Through-hole via filling material inks that are suitable for use in conjunction with additional HTBPIH 190 of CCPPME 100 of FIG. 1B preferably include a solvent and a thickener solvent, as well as a humectant and a surfactant. The thickener solvent adjusts the viscosity of the through-hole via filling material ink to a viscosity suitable for ejection from a nozzle, as required for ink-jet printing. Viscosity of the through-hole via filling material ink is preferably in the range of 5-15 cps at the printer operating temperature. Preferably, the solvent has a boiling point below 100° C., aiding fast drying of the through-hole via filling material ink. Additionally, the solvent is preferably of low risk to humans and the environment, having, inter alia, relatively low toxicity, flammability and reactivity properties. The post-curing process of the through-hole via filling material ink preferably occurs at a temperature below 200° C. Typical solvents include water, n-propanol, 2-methoxy-2-propanol and iso-butanol. Typical thickener solvents include propylene glycol (10-20 wt. %), dipropylene glycol (10-20 wt. %) and triethylene glycol (10-20 wt. %).

As noted above, the through-hole via filling material ink preferably includes a humectant. The humectant prevents the through-hole via filling material ink from solidifying on the nozzle plate prior to ejection from additional HTBPIH 190. Typical humectants include glycols, such as glycerol (1-3 wt. %), and glycol ethers, such as ethylene glycol monobutyl ether (5-10 wt. %) and dipropylene glycol dimethyl ether (2-6 wt. %).

As noted above, the through-hole via filling material ink preferably includes a surfactant. The surfactant adjusts the surface tension of the through-hole via filling material ink, affecting both the drop size and wettability thereof. Surface tension of the through-hole via filling material ink is preferably in the range of 20-30 dyn/cm. Drop size of the through-hole via filling material ink ejected by additional HTBPIH 190 is preferably in the range of 6-60 pL. Typical surfactants include silicon polymers, such as BYK-345 (0.1-0.3 wt. %), BYK-310 (0.1-0.5 wt. %) and BYK-3760 (0.1-0.5 wt. %), commercially available from BYK-Chemie GmbH, Wesel, Germany, and fluoropolymers, such as Capstone™ 1157 (0.01-0.05 wt. %), Capstone™ 1460 (0.05-0.1 wt. %) and Capstone™ 1475 (0.01-0.05 wt. %), commercially available from DuPont Inc., USA.

Figure 2A:
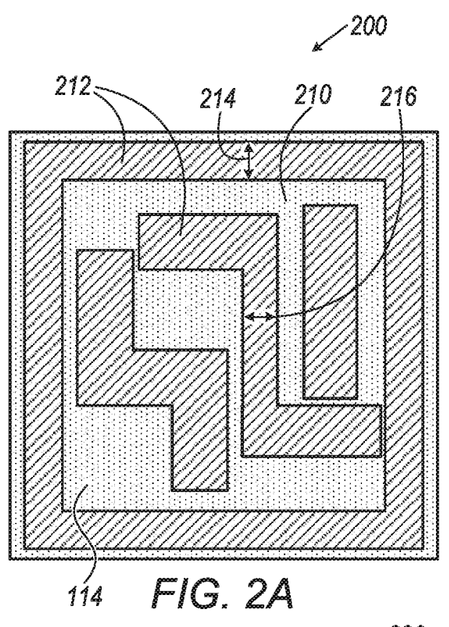
FIGS. 2A-2C are simplified illustrations of a printed circuit board (PCB) product prepared by the CCPPME of FIG. 1, illustrating various stages of preparation.
Figure 2B:
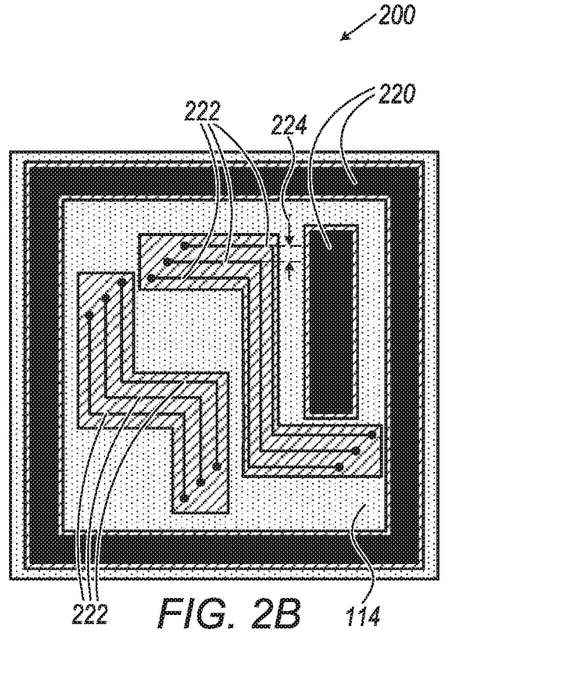
Figure 2C:
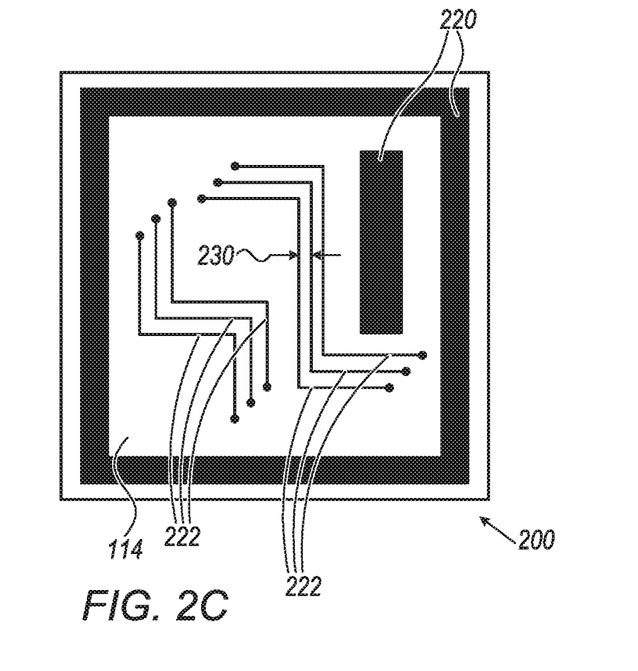

Reference is now made to FIGS. 2A-2C, which are simplified illustrations of a PCB product 200 prepared by CCPPME 100 (FIG. 1), illustrating various stages of preparation. It is noted that FIGS. 2A-2C are not drawn to scale. FIG. 2A shows a PCB product 200, including a PCB substrate 114 formed with a copper layer 210 covering an upper surface thereof, wherein copper layer 210 typically has a thickness between 0.2-36 μm. PCB product 200 shown in FIG. 2A also includes at least one printed pattern 212, selectively printed on copper layer 210 by first HTBPIH 130, and optionally by second HTBPIH 150. It is noted that printed pattern 212 has length and width dimensions as small as 50 μm, as indicated by a pair of arrows 214 and 216.

Printed pattern 212 includes a photosensitive printed pattern, printed by first HTBPIH 130, with atypical thickness of between 0.5-5 μm, and optionally includes a non-oxygen permeable printed pattern, printed by second HTBPIH 150, with a thickness of between 0.1-3 μm. As described hereinabove, the optional non-oxygen permeable printed pattern is printed over the photosensitive printed pattern.

FIG. 2B shows PCB product 200 having printed pattern 212 after having been selectively exposed by pattern exposer 180, producing exposed patterns 220 and 222. It is appreciated that, as seen in FIG. 2B, the width of exposed patterns 220 are of a different order of magnitude than exposed patterns 222. It is noted that the exposed pattern 222 has an L/S as small as 5/5 μm, as indicated by arrows 224.

FIG. 2C shows PCB product 200 after developing of printed pattern 212 and exposed patterns 220 and 222 and subsequent etching of copper layer 210. It is noted that following the etching of copper layer 210, exposed pattern 222 has an L/S, as indicated by arrows 230, as small as 10/10 μm.

Figure 3:
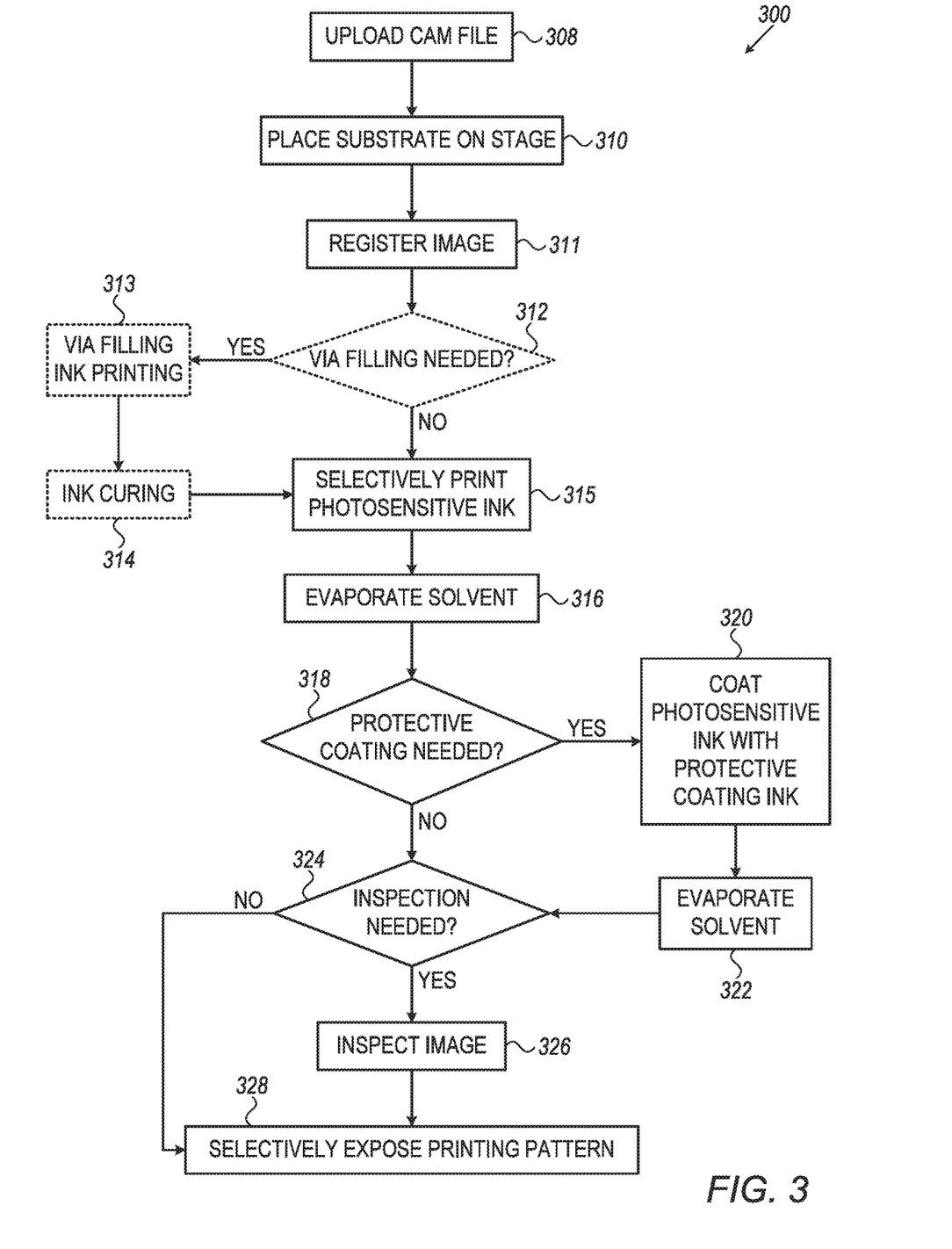
FIG. 3 is a simplified flowchart illustrating a typical printing and exposure preparation method useful in preparing the PCB product of FIGS. 2A-2C using the CCPPME of FIG. 1A or of FIG. 1B.
Figures 4A, 4E:
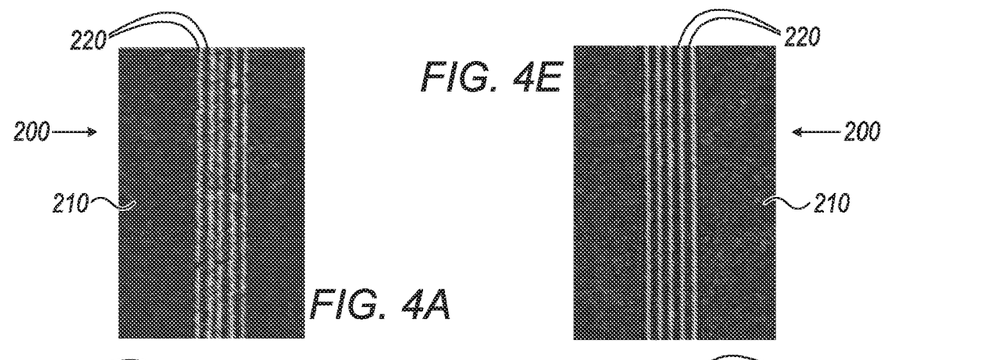
FIGS. 4A-4H are images of the PCB product of FIGS. 2A-2C, taken by an optical microscope.
Figures 4B, 4F:
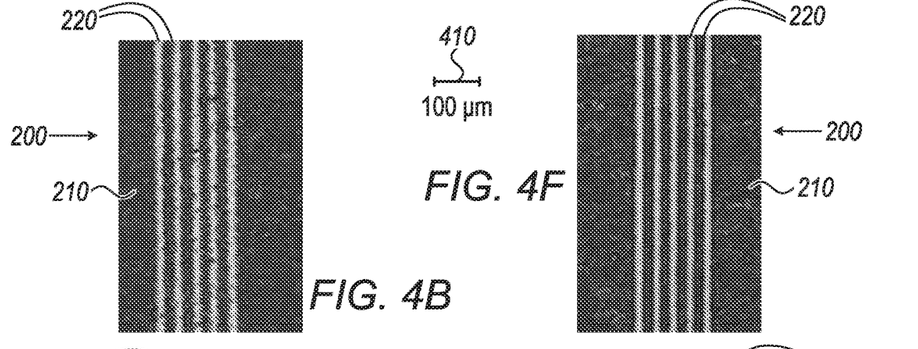
Figures 4C, 4G:
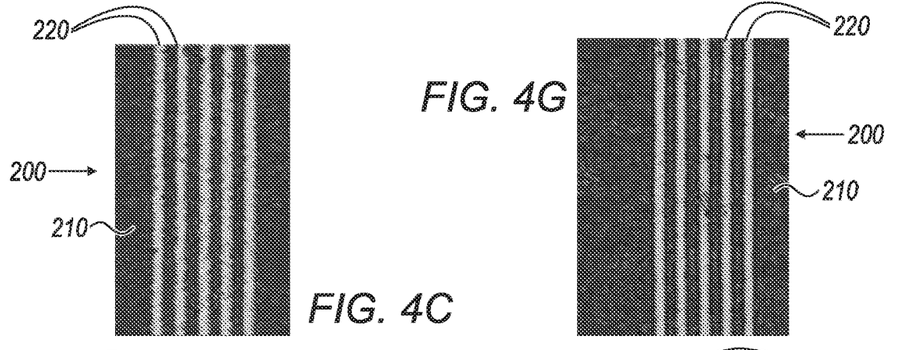
Figures 4D, 4H:
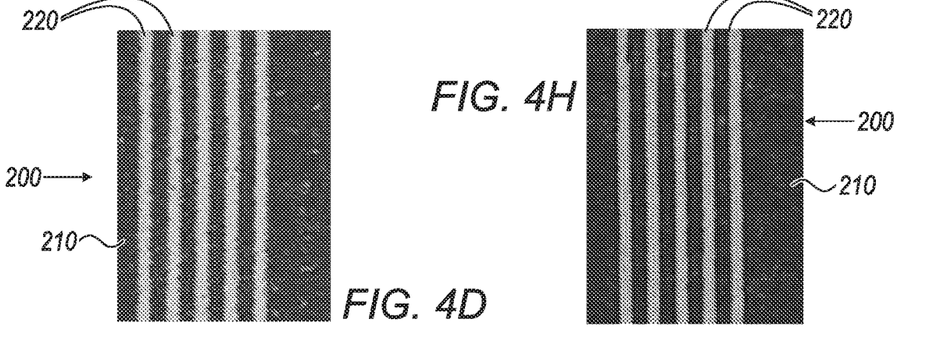

Reference is now made to FIG. 3, which is a simplified flowchart illustrating a typical printing and exposure preparation method 300 useful in preparing PCB product 200 (FIGS. 2A-2C) using CCPPME 100 (FIG. 1). CCPPME 100 is preferably used in conjunction with other tools as part of a larger fabrication process. It is noted that printing and exposure preparation method 300 is particularly suited to be part of a subtractive fabrication process, but is not limited to use therewith.

It is appreciated that while the embodiment description hereinbelow describes printing and exposure preparation method 300 being used to prepare PCB product 200, including PCB substrate 114 formed with copper layer 210 on an upper surface thereof, wherein copper layer 210 typically has a thickness between 0.5-36 µm, printing and exposure preparation method 300 may also be carried out using substrates having a conductive layer of a different material and/or thickness or a non-conductive upper layer. Typically, when PCB substrate 114 includes a temporary protective layer, such as a chromate protective layer, the protective layer is removed, as part of the processing, prior to printing and exposure preparation method 300.

It is appreciated that using liquid photoresist coatings preferably eliminates the need for a micro-etch process, which is needed to increase surface roughness and thereby to increase the physical adhesion between a copper layer and dry photoresist film, since the liquid photoresist coating is chemically adhered to the copper layer. The liquid photoresist coating is preferably printed on relatively smooth surfaces. The use of the liquid photoresist coating can be advantageous to reduce process steps and material waste. Furthermore, use of liquid photoresist is advantageous when working with smooth surfaces, such as flex material or materials used for high frequency applications.

Preferably, the copper surface is wipe-cleaned, with a wipe immersed in an ink solvent, to increase ink wettability and coating quality. Removing a protective chromate layer from a copper surface by oxidation provides a highly reactive and hydrophobic copper surface, while applying a suitable solvent to this reactive surface and allowing it to evaporate, which typically takes a few seconds, leaves the copper surface less reactive and more compatible to the liquid photoresist ink.

As seen in FIG. 3, at a first step 308, a user uploads a suitably-formatted computer aided manufacturing (CAM) file to CCPPME 100, including instructions for desired printing and exposure of the PCB substrate 114 to be processed. At a next step 310, PCB substrate 114 to be processed is placed on stage 112 of CCPPME 100 and is advanced to camera 118 for registration of PCB substrate 114, as seen at a registration step 311. It is appreciated that common stage 112 advances PCB substrate 114 in an unchanging manner, such that following registration of PCB substrate 114 by camera 118 at step 311, no further registration is necessary while PCB substrate 114 is supported by common stage 112 during printing and exposure preparation method 300.

When using the CCPPME 100 of FIG. 1B, at a next step 312, method 300 checks the CAM file to see if through-hole vias need to be printed. Preferably, when printing through-hole vias, the CAM file includes the exact coordinates for the locations and sizes of vias as well as instructions for desired printing and exposure of the vias.

If through-hole vias need to be printed, PCB substrate 114 is advanced to HTBPIH 190 for printing of via filling ink, as seen in step 313. PCB substrate 114 is thereafter advanced by stage 112 to an ink curing step 314, where the via filling ink is rendered impervious to the downstream developing and etching processes.

When using the CCPPME 100 of FIG. 1A, following registration step 311, or when using the CCPPME 100 of FIG. 1B, following step 312 when through-hole vias do not need to be printed, or following ink curing step 314 when through-hole vias do need to be printed, the portion of PCB substrate 114 being processed is generally advanced to first HTBPIH 130 for selective printing of photosensitive ink, as seen at a photosensitive ink printing step 315. It is noted that first HTBPIH 130 prints photosensitive ink to form a printed pattern, such as printed pattern 212, that covers all areas of PCB substrate 114 containing material that will be retained during an etching stage that follows printing and exposure preparation method 300. The portion of PCB substrate 114 being processed is then advanced by stage 112 to first ink dryer 140 where the solvent present in the photosensitive ink is evaporated, as seen at a first drying step 316. By varying the print settings and ink used, following the solvent evaporation at first drying step 316, the length and width dimensions of features printed at photosensitive ink printing step 315 may be as small as 50 µm, and the height of the features printed at photosensitive ink printing step 315 is in a range of 0.5-5 µm.

As seen in steps 318, 320 and 322, in some embodiments of the present invention, the features that were printed in photosensitive ink printing step 315 require coating with a non-oxygen permeable coating. The non-oxygen permeable coating for the photosensitive ink is necessary when the photosensitive ink includes a photoresist utilizing radical polymerization and the photosensitive ink is exposed in the presence of oxygen.

When non-oxygen permeable coating is needed, the portion of PCB substrate 114 being processed is advanced to second HTBPIH 150 for selective printing of non-oxygen permeable ink, as seen at non-oxygen permeable ink printing step 320. It is noted that the non-oxygen permeable ink is preferably printed on all of printed pattern 212 and is not printed in other regions of PCB product 200.

When non-oxygen permeable coating is needed, the portion of PCB substrate 114 being processed is then advanced to second ink dryer 160 and the solvent present in the non-oxygen permeable ink is evaporated, as seen at a second drying step 322. By varying the print settings and ink used, following the second drying step 322, the length and width dimensions of features printed at non-oxygen permeable ink printing step 320 may be in a range from 50 µm to the largest dimension of PCB substrate 114, and the height of the features printed at non-oxygen permeable ink printing step 320 is in a range of 0.1-3 µm.

It is appreciated that during steps 315-322, PCB product 200 preferably corresponds to FIG. 2A. It is a particular feature of an embodiment of the present invention that the non-oxygen permeable ink printed at non-oxygen permeable ink printing step 320 is printed over the photosensitive ink and is operative to protect the photosensitive ink from oxidation during exposure, but the non-oxygen permeable ink printed at non-oxygen permeable ink printing step 320 does not increase the minimum length and width dimensions of exposed pattern 220.

The process continues with an optional inspection step, as seen at steps 324 and 326, following either first drying step 316, when a non-oxygen permeable coating is not required, or second drying step 322, when a non-oxygen permeable coating is required. In the case that inspection is needed, the portion of PCB substrate 114 being processed is advanced to camera 170, and PCB substrate 114 is inspected to ensure that there are minimal pinholes in the printed pattern, as seen in step 326. It is appreciated that the liquid composition of the printed ink, along with the height of printed pattern 212, facilitates adhesion of the ink to PCB substrate 114.

The process continues with a next step 328, in which the portion of PCB substrate 114 being processed is advanced to pattern exposer 180, and printed pattern 212 is selectively exposed, forming exposed pattern 220. It is appreciated that following step 328, PCB product 200 preferably corresponds to FIG. 2B. Exposed pattern 220 is characterized by an L/S as small as 5/5 µm. It is noted that printed pattern 212 is selectively exposed, forming exposed pattern 220 overlying material that will be retained during an etching step that follows printing and exposure preparation method 300. After step 328, PCB substrate 114 is ready for further processing that follows printing and exposure preparation method 300.

It is noted that printing and exposure preparation method 300 preferably forms part of a method for preparing a PCB product having highly dense conductors. Following printing and exposure preparation method 300, printed pattern 212 is developed and rinsed, removing unexposed portions of the photosensitive printed pattern and all of the non-oxygen permeable printed pattern, if one was used, leaving only exposed pattern 220 masking PCB substrate 114. It is a particular feature of the present invention that the developed pattern is characterized by an L/S as small as 5/5 µm. It is a further feature of an embodiment of the present invention that due to the height of printed pattern 212 and thus of exposed pattern 220, as described hereinabove with reference to FIGS. 2A-3, a printed pattern 212 fabricated using CCPPME 100 and printing and exposure preparation method 300 may be developed and rinsed in a shorter time than is possible for a similar pattern fabricated using typical known photolithographic methods.

Reference is now made to FIGS. 4A-4H, which are images of a PCB product, such as PCB product 200 (FIGS. 2A-2C), taken by an optical microscope. Magnification of FIGS. 4A-4H is indicated by a scale bar 410. It is noted that FIGS. 4A-4H show exposed pattern 220 after it has been developed. It is further noted that the exposed patterns 220 illustrated in FIGS. 4A-4D are formed from photosensitive ink without an adhesion promoter, and the exposed patterns 220 illustrated in FIGS. 4E-4H are formed from photosensitive ink including an adhesion promoter.

Figure 5A:
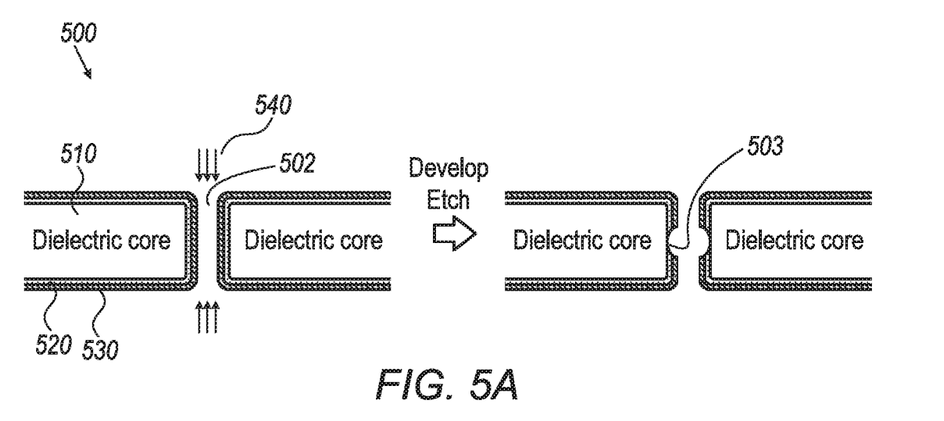
FIGS. 5A, 5B and 5C are simplified illustrations of methods of preparing a PCB product containing through-hole vias, which may be prepared using the CCPPME of FIG. 1B.

Reference is now made to FIG. 5A which includes two simplified sectional images of a PCB board 500 containing a through-hole via 502. FIG. 5A illustrates a problem that may occur during formation of through-hole via 502. As seen in FIG. 5A, both the PCB board 500 and the through-hole via 502 are coated with thin copper layer 520 on a dielectric core 510. PCB board 500 and copper layer 520 are then coated with a photoresist ink 530, which covers copper layer 520 of the entire board. Coated PCB board 500, including copper layer 520, is then exposed using a pattern exposer, typically an LDI exposer, as indicated by arrows 540. During the exposing step, the light polymerizes the photoresist ink 530 close to the edge of the through-hole via 502, but does not polymerize the center of the inside wall of through-hole via 502. After a developing process, the photoresist ink 530 that was not polymerized is washed out, leaving a portion of copper layer 520 underneath unprotected during a subsequent etching process. This may result in a non-conductive area 503 in the though-hole via 502.

Figure 5B:
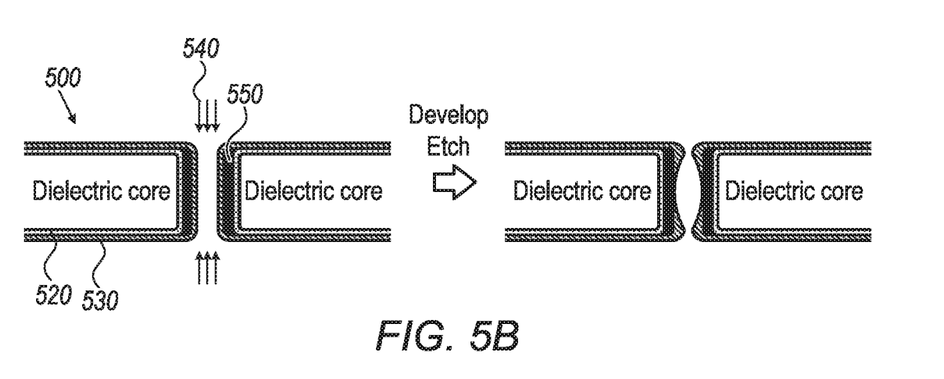

Reference is now made to FIG. 5B, which illustrates a first method of overcoming the problem described in FIG. 5A. As seen in FIG. 5B, printing a via filling ink 550 in through-hole via 502 before applying photoresist ink 530, and subsequent exposing 540 of photoresist ink 530, provides a protective layer over the copper surface in the though-hole via during the developing and etching process.

Figure 5C:
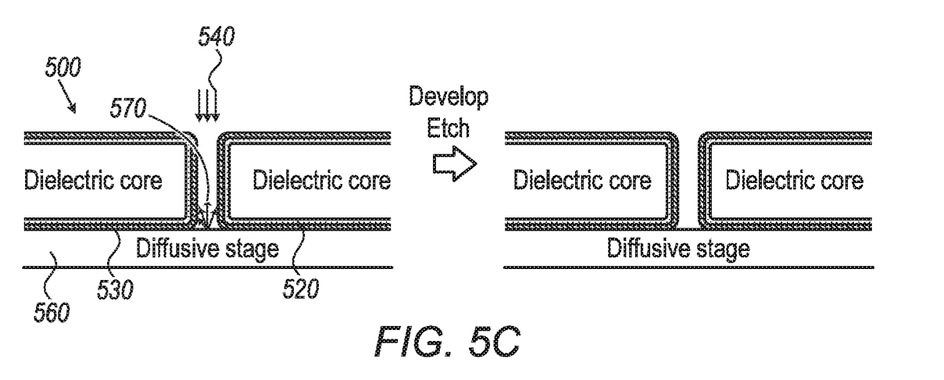

Reference is now made to FIG. 5C, which illustrates a second method of overcoming the problem described in FIG. 5A. FIG. 5C illustrates the production of a PCB board on a stage containing a diffusive layer 560. During the exposure process the laser light which reaches the diffusive layer is backscattered, as indicated by arrows 570, leading to the polymerization of the entire photoresist ink 530 within the through hole via 502, which therefore protects the copper layer 520 during the etch process.

Following the process described in FIG. 3 above, after developing printed pattern 212, the larger fabrication process continues. It is appreciated that while the next step of the larger fabrication process described hereinbelow is a copper surface layer wet etching step, the next step of the larger fabrication process may be any suitable step that follows a lithographic process, including, inter alia, a dry etching step, a non-conducting surface etching step or an ion implantation step, as is known to those of ordinary skill in the art.

Copper layer 210 may be etched using any suitable etching process, such as wet etching. Typical etching solutions suitable for wet etching include one of the following components: copper salts such as $CuCl_2$, ferric salts such as $FeCl_3$, chromic-sulfuric acids, persulfate salts, sodium chlorite and hydrogen peroxide. A typical etching process includes spraying an etching solution onto copper layer 210.

It is appreciated that following the etching step, PCB product 200 preferably corresponds to FIG. 2C. Due to the thickness of printed pattern 212, as described hereinabove with reference to FIGS. 2A-3, as well as the presence of banking agents in the printed pattern, as described hereinabove with reference to the photosensitive ink, anisotropy of etching, and thus rectilinearity of conductors, is increased, allowing conductors to be more closely spaced.

It is noted that the printing and exposure preparation method 300 of the present invention may be utilized for the fabrication of etched conductors having various dimensions. It is a particular feature of an embodiment of the present invention that etched conductors having an L/S of 10/10 µm may be fabricated in conjunction with the printing and exposure preparation method 300 of the present invention. By way of example, a copper layer having a height of 18 µm may be etched as described hereinabove to form highly dense conductors having an L/S as small as 25/25 µm, while a copper layer having a height of 5 µm may be etched as described hereinabove to form highly dense conductors having an L/S as small as 10/10 µm.

After etching of the layer beneath exposed pattern 220, exposed pattern 220 may optionally be stripped. Due to the thickness of printed pattern 212, and thus of exposed pattern 220, as described hereinabove with reference to FIGS. 2A-3, exposed pattern 220 fabricated using CCPPME 100 and printing and exposure preparation method 300 may be stripped with greater ease and in a shorter time than is possible for a similar pattern fabricated using typical known photolithographic methods. Furthermore, stripping of exposed pattern 220 may be obviated in some cases, and processing may proceed with exposed pattern 220 in place.

It will be appreciated by persons skilled in the art that the present invention is not limited to what has been specifically described and shown herein but also includes combinations and sub-combinations of features described herein and modifications thereof which are not in the prior art.

The invention claimed is:

1. Apparatus for use in preparing a PCB product having highly dense conductors, the apparatus comprising:
   a common chassis;
   an inkjet printer mounted on said common chassis and being operative to selectively print unexposed photosensitive patterns on a PCB substrate, said unexposed photosensitive patterns having a thickness of less than 5 μm, wherein said unexposed photosensitive patterns are printed with a photosensitive ink comprising:
- a photoresist constituting 33-64 wt. % of said photosensitive ink;
- a solvent constituting 19.99-59.99 wt. % of said photosensitive ink;
- a humectant constituting 1-10 wt. % of said photosensitive ink;
- a surfactant constituting 0.01-0.1 wt. % of said photosensitive ink;
- an adhesion promoter constituting 1-3 wt. % of said photosensitive ink, said adhesion promoter having a molecular weight between 1700-70000 Da; and
- a basic solution constituting 2-3 wt. % of said photosensitive ink, said adhesion promoter being dissolved in said basic solution; and a pattern exposer mounted on said common chassis and being operative to expose said photosensitive patterns to radiation thereby to define exposed patterns, said exposed patterns having a pitch of less than 20 μm.

2. Apparatus according to claim 1 and wherein said inkjet printer comprises:
- a first inkjet head operative to print said unexposed photosensitive patterns of photosensitive ink; and
- a second inkjet head operative to print non-oxygen permeable patterns of non-oxygen permeable ink.

3. Apparatus according to claim 2 and wherein said non-oxygen permeable patterns are printed with a non-oxygen permeable ink comprising:
- a polymer constituting 10-15 wt. % of said non-oxygen permeable ink, said polymer having a minimum molecular weight of 7000 Da;
- one or more solvents constituting a total of 63.9-68.99 wt. % of said non-oxygen permeable ink;
- a thickener solvent constituting 20 wt. % of said non-oxygen permeable ink;
- a humectant constituting 1 wt. % of said non-oxygen permeable ink; and
- a surfactant constituting 0.01-0.1 wt. % of said non-oxygen permeable ink.

4. Apparatus according to claim 2 and wherein nozzle plates of said inkjet heads are operative to be heated to between 40-60° C. for optimum viscosity of said photosensitive ink and said non-oxygen permeable ink.

5. Apparatus according to claim 1 and wherein said apparatus comprises a hood at least partially surrounding said common chassis, said inkjet printer and said pattern exposer.

6. Apparatus according to claim 5 and wherein an atmosphere in said hood is characterized by an inert gas flow operative to prevent oxidation of said unexposed photosensitive patterns during exposure thereof by said pattern exposer.

7. Apparatus according to claim 1 and also comprising at least a first ink dryer, operative to dry said unexposed photosensitive patterns.

8. Apparatus according to claim 7 and wherein said first inkjet head, said at least first ink dryer and said second inkjet head are arranged such that stepwise advancement of said PCB substrate along said common chassis allows said unexposed photosensitive patterns to be dried by said at least first ink dryer before said second inkjet head prints said non-oxygen permeable patterns.

9. Apparatus according to claim 1 and also comprising a camera operative to inspect at least one of said unexposed photosensitive patterns and non-oxygen permeable patterns of non-oxygen permeable ink.

10. Apparatus according to claim 1 and wherein said pattern exposer comprises at least one light source that emits light in a range between 355-460 nm.

11. Apparatus for preparing a PCB product according to claim 1 and wherein said adhesion promoter is operative to increase anisotropy of a wet etching process of a copper component on which said photosensitive ink is printed.

12. Apparatus for preparing a PCB product according to claim 1 and wherein said photosensitive ink has a surface tension of less than 30 dyn/cm.

13. A photosensitive ink for use in an inkjet printer, said photosensitive ink comprising:
- a photoresist constituting 33-64 wt. % of said photosensitive ink;
- a solvent constituting 19.99-59.99 wt. % of said photosensitive ink;
- a humectant constituting 1-10 wt. % of said photosensitive ink;
- a surfactant constituting 0.01-0.1 wt. % of said photosensitive ink;
- an adhesion promoter constituting 1-3 wt. % of said photosensitive ink, said adhesion promoter having a molecular weight between 1700-70000 Da, wherein said adhesion promoter is operative to increase anisotropy of a wet etching process of a copper component on which said photosensitive ink is printed; and
- a basic solution constituting 2-3 wt. % of said photosensitive ink, said adhesion promoter being dissolved in said basic solution.

14. A photosensitive ink according to claim 13 and wherein said photosensitive ink is operative to form printed features having a height of less than 5 μm.

* * * * *